United States Patent

Shibatani et al.

[11] Patent Number: 5,276,367
[45] Date of Patent: Jan. 4, 1994

[54] OFFSET DRIFT REDUCING DEVICE FOR USE IN A DIFFERENTIAL AMPLIFICATION CIRCUIT

[75] Inventors: Kanji Shibatani; Masao Hagiwara; Masakazu Moritoki, all of Hiratsuka, Japan

[73] Assignee: Kabushiki Kaisha Komatsu Seisakusho, Tokyo, Japan

[21] Appl. No.: 885,894

[22] Filed: May 20, 1992

Related U.S. Application Data

[63] Continuation-in-part of Ser. No. 699,124, May 13, 1991, abandoned.

[30] Foreign Application Priority Data

May 14, 1990 [JP] Japan .................. 2-123460

[51] Int. Cl.⁵ .................................. H03K 5/24
[52] U.S. Cl. ......................... 307/494; 307/491; 307/352; 307/529; 328/127; 328/158; 328/159; 328/160
[58] Field of Search ............ 307/491, 494, 352, 529, 307/359; 328/127, 158, 159, 160, 147

[56] References Cited

U.S. PATENT DOCUMENTS

| | | | |
|---|---|---|---|
| 3,654,560 | 4/1972 | Cath et al. | 328/127 |
| 4,553,052 | 11/1985 | Takahashi | 307/491 |
| 4,617,481 | 10/1986 | Masuda | 307/491 |
| 4,714,843 | 12/1987 | Smith | 307/491 |
| 4,754,226 | 6/1988 | Lusignan et al. | 307/529 |
| 4,827,161 | 5/1989 | Kunitoki et al. | 307/491 |
| 4,899,068 | 2/1990 | Klose et al. | 307/494 |
| 4,943,736 | 7/1990 | Kihara et al. | 307/491 |
| 5,028,815 | 7/1991 | Van de Plassche | 307/491 |

Primary Examiner—John S. Heyman
Assistant Examiner—My Trang
Attorney, Agent, or Firm—Varndell Legal Group

[57] ABSTRACT

In a measuring differential amplifier having first and second input terminals for subtracting a first signal applied to the first input terminal from a second signal applied to the second input terminal to obtain a subtraction and for outputting a signal corresponding to A times of the subtraction, a circuit for reducing an offset generated during measurement. Prior to the measurement, the second signal is applied to the first and second input terminals so that the differential amplifier outputs a voltage corresponding to A times of a difference between the second signals, i.e., A times an offset voltage. At this time, the differential amplifier is connected at its output terminal to one end of a capacitor grounded at the other end so that the voltage corresponding to A times of the offset voltage is applied to the capacitor for charging. During the measurement, the output terminal of the differential amplifier is disconnected from one end of the capacitor so that the voltage charged in the capacitor is applied to the adder and multiplied by 1/A to become again the offset voltage. The adder adds a signal indicative of the offset voltage to the first signal to obtain an addition signal and supplies the addition signal to the first input terminal of the differential amplifier. Thus, the input offset voltage is canceled by an offset voltage newly generated at the differential amplifier.

1 Claim, 3 Drawing Sheets

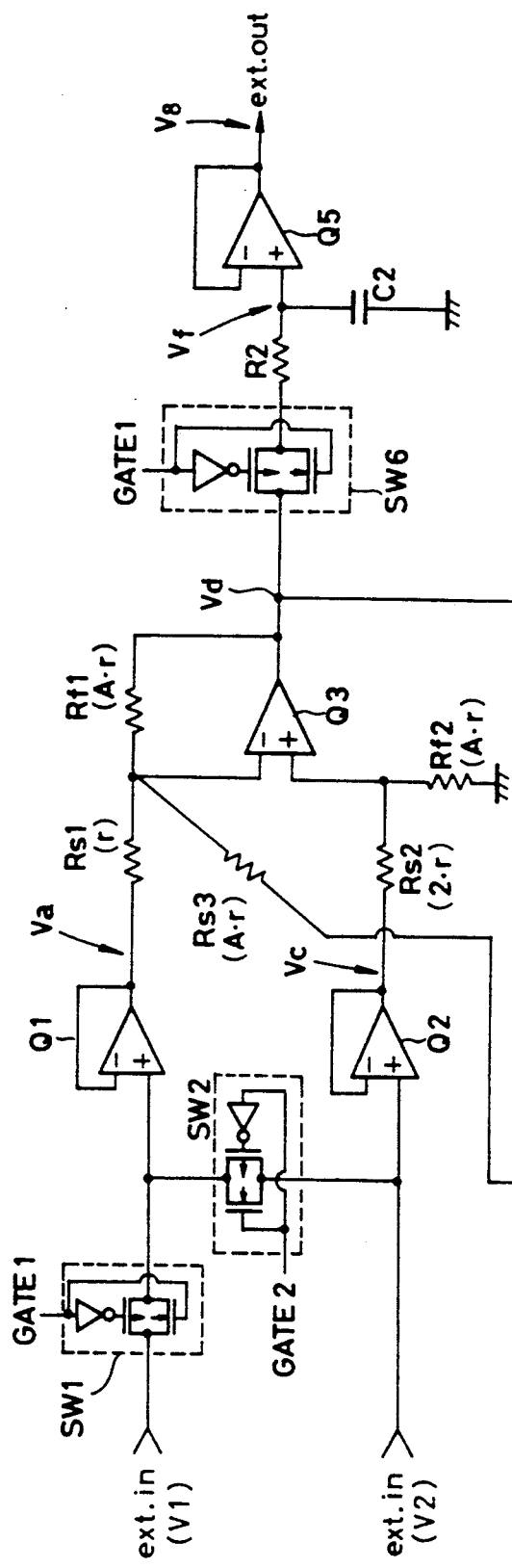
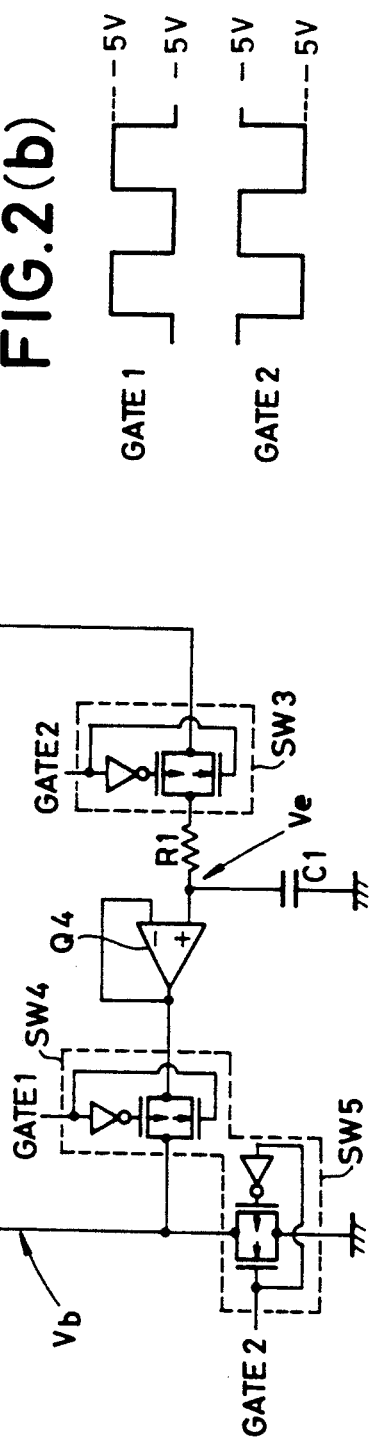
FIG.2 (a)
FIG.2 (b)

OFFSET DRIFT REDUCING DEVICE FOR USE IN A DIFFERENTIAL AMPLIFICATION CIRCUIT

This application is a continuation-in-part of the application Ser. No. 07/699,124 filed on May 13, 1991 now abandoned.

BACKGROUND OF THE INVENTION

1. Field of the Invention

The present invention relates to a differential amplification circuit which has a differential amplifier having two input terminals for outputting a difference between first and second signals applied to the two input terminals and more particularly, to a offset drift reducing device for a differential amplification circuit which can reduce an offset drift generated at a differential amplifier in the differential amplification circuit.

2. Description of the Related Art

An example of the application of a differential amplification circuit is that it receives a D.C. voltage supplied from a temperature sensor at its one input terminal and a D.C. voltage corresponding to a reference temperature at the other input terminal, and outputs a difference between these D.C. voltages. The differential amplification circuit comprises an operational amplifier. However, the operational amplifier usually generates an offset voltage drift. For a general operational amplifier, this offset voltage drift is 50 uV/Cmax. Assuming that the differential gain is 25 and a temperature range is between 0° and 40° C., a temperature drift becomes 50 mV. For the purpose of reducing such a temperature drift, a low temperature-drift operational amplifier such as OP07 manufactured by the PMI company has been often employed.

FIG. 3 shows an example of a conventional circuit which includes a buffer Q1' for inputting a signal from a sensor, a buffer Q3' for inputting a reference voltage and a differential amplifier Q2'. The buffers Q1', Q3' and differential amplifier Q2' comprise an operational amplifier OP07 as mentioned above, respectively. To the buffer Q1', a voltage V1, which is detected at the sensor such as a thermistor, is applied. Then, the buffer Q1' generates an offset voltage e1. To the buffer Q3', a reference voltage V2 corresponding to a target temperature is applied. Then, the buffer Q3' generates an offset voltage e3. The outputs of the buffers Q1' and Q3' are applied to the differential amplifier Q2', which outputs a difference voltage Vd between the outputs of the buffers Q3' and Q1'. The difference voltage Vd is expressed as follows where A is a gain of the differential amplifier Q2'.

$$Vd = A \times (V2 - V1 + e2 + e3 - e1) \quad (1)$$

The equation (1) shows that the output of the differential amplifier Q2' contains an offset voltage of $A \times (e2+e3-e1)$ in addition to the difference voltage of $A \times (V2-V1)$. In this circuit, since the low temperature-drift operational amplifier OP07 is used for the buffers Q1', Q2' and the differential amplifier Q3', the offset voltage $A (e2+e3-e1)$ is small and thus a temperature drift is reduced.

However, it is difficult to incorporate the low temperature-drift operational amplifiers in an application specific integrated circuit (ASIC). This is because the operational amplifier OP07 is 4 to 5 times larger in size than a general operational amplifier, and the operational amplifier OP07 cannot be accommodated in a chip.

As described above, the temperature drift could be reduced by using the low temperature-drift (low offset) operational amplifiers in the circuit of FIG. 3. However, it is difficult to make such circuits in the form of ASIC.

SUMMARY OF THE INVENTION

In view of such circumstances, it is an object of the present invention to provide a circuit which comprises general operational amplifiers while enabling reduction of an offset voltage.

In accordance with the present invention, there is provided an offset drift reducing device for use in a differential amplification circuit including a differential amplifier having a first input terminal for inputting a first signal and a second input terminal for inputting a second signal, the differential amplifier subtracting a value of the first signal from a value of the second signal, multiplying the value thus subtracted by A and outputting the value thus multiplied, the offset drift reducing device comprising: an adder having third and fourth input terminals, for adding a signal which is 1/A times of a signal applied to the third input terminal and a signal applied to the fourth input terminal and for outputting the signal thus added to the first input terminal of the differential amplifier; first and second switches provided in first and second lines for opening and closing the first and second lines to selectively supply the first signal and the second signal to the fourth input terminal of the adder; a capacitor one terminal of which is connected to a third line connecting an output terminal of the differential amplifier and the third input terminal of the adder and another terminal of which is grounded; a third switch for opening and closing the third line connecting the output terminal of the differential amplifier and one end of the capacitor; a fourth switch for opening and closing the third line connecting one end of the capacitor and the third input terminal of the adder; a fifth switch connected at its one end to the third input terminal of the adder and grounded at another end, for grounding the third input terminal when turned on; and switch on/off controller for turning off the first and fourth switches and turning on the second, third and fifth switches prior to a measurement and for turning on the first and fourth switches and turning off the second, third and fifth switches during the measurement.

In the circuit with this arrangement, prior to a measurement, when the first switch is turned OFF and the second switch is turned ON, only the second signal is applied to the fourth input terminal of the adder. Since the fifth switch is ON and the fourth switch is OFF, a ground voltage, i.e., 0 V is applied to the third input terminal of the adder. Accordingly, the adder outputs only the second signal to the first input terminal of the differential amplifier.

Meanwhile, since the same signal (second signal) is applied to the second input terminal of the differential amplifier, the differential amplifier outputs a voltage corresponding to A times the difference between the second signals, i.e., a voltage which is A times of the offset voltage. At this time, the third switch is turned ON so that the third line connected between the output terminal of the differential amplifier and one end of the capacitor is closed, so that the voltage corresponding to A times of the offset voltage is charged and held in the capacitor.

During measurement, the first switch is turned ON and the second switch is turned OFF so that only the first signal is applied to the fourth input terminal of the adder and the second signal is applied to the second input terminal of the differential amplifier. At this time, the third switch is turned OFF, the fourth switch is turned ON and the fifth switch is turned OFF, so that the voltage charged in the capacitor is applied to the third input terminal of the adder. The charged voltage of the capacitor is multiplied by 1/A to be an offset voltage of the differential amplifier.

This offset voltage added to the first signal is applied to the first input terminal of the differential amplifier. The differential amplifier subtracts the offset voltage and first signal applied to the first input terminal from the second signal applied to the second input terminal, and multiplies the second signal thus subtracted by A.

During the subtracting operation, the differential amplifier generates an offset voltage. However, the generated offset voltage is canceled by the offset voltage applied to the first input terminal. As a result, the differential amplifier outputs the value of the second signal subtracted by the value of the first signal without any offset.

BRIEF DESCRIPTION OF THE DRAWINGS

FIG. 2(a) is a detailed circuit configuration of the offset drift reducing circuit in the differential amplification circuit in accordance with the embodiment of the present invention;

FIG. 2(b) shows waveforms of signals applied to the switches in the circuit of FIG. 2(a)

DESCRIPTION OF THE PREFERRED EMBODIMENTS

An embodiment of in offset drift reducing device in a differential amplification circuit in accordance with the present invention will be explained with reference to the accompanying drawings. In the illustrated embodiment, the present invention is applied to a temperature control circuit such as a control circuit for controlling the temperature of a thermoelectric element (Peltier element). In the following explanation of the embodiment, it is assumed that a target temperature setter for setting such a temperature sensor as a thermistor and a target temperature is provided at its previous stage.

Figure 1:
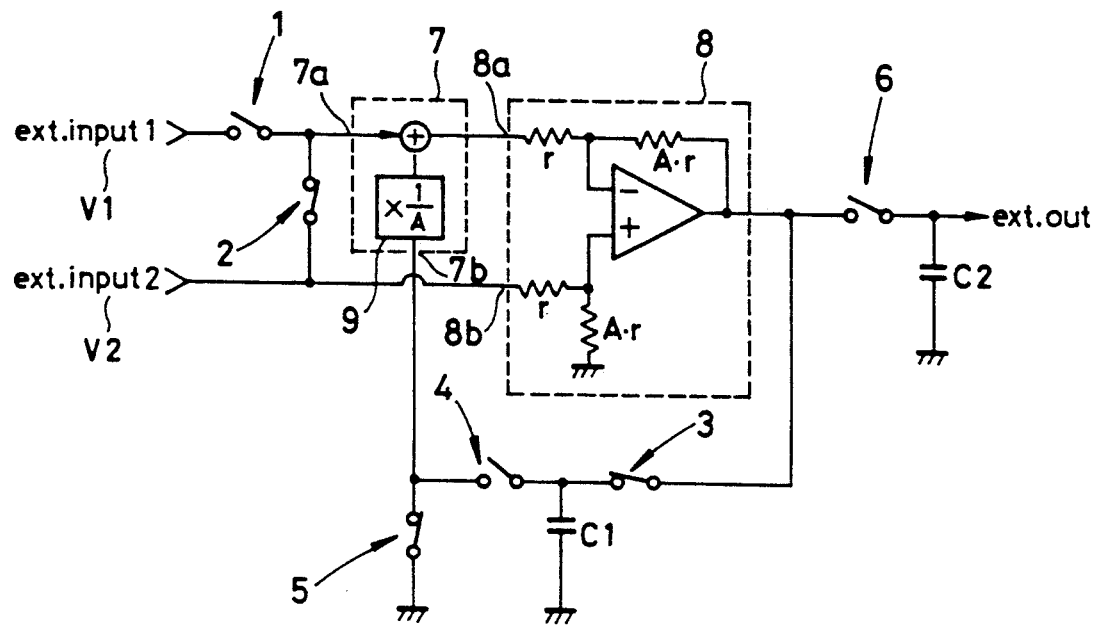
FIGS. 1(a) and (b) shows a circuit configuration of an offset drift reducing device in a differential amplification circuit in accordance with an embodiment of the present invention.
Figure 1:
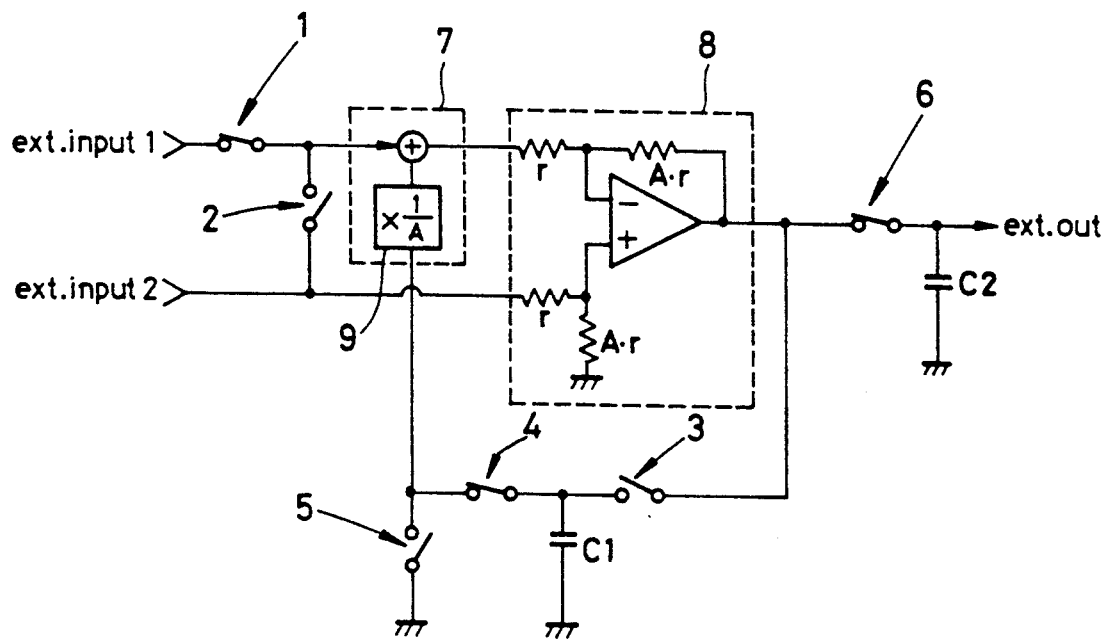

Referring to FIG. 1, a differential amplification circuit comprises a differential amplifier 8 made of an operational amplifier as a main constituent element. The differential amplifier 8 has a gain of A.

A switch 1 is provided in a line connecting a temperature sensor which detects temperature and outputs a detected voltage V1 corresponding to the detected temperature and an adder 7. The switch 1 is an analog switch and serves to close and open the line. When the switch 1 is turned on, the voltage V1 is applied as an external input to an input terminal 7a of the adder 7, whereas when turned off, the line is cut off with the result that the voltage V1 is not applied to the input terminal 7a of the adder 7.

A switch 2 is an analog switch for opening and closing a line connecting a target temperature setter for outputting a voltage V2 corresponding to a target temperature and the adder 7. When the switch 2 is turned on, the voltage V2 is applied to the input terminal 7a of the adder 7 as an external input; whereas when turned off, the line is cut off so that the voltage V2 is not applied to the adder 7. The voltage V2 is always applied to a plus input terminal 8b of the differential amplifier 8.

A switch 3 is an analog switch and is provided in a line connecting one terminal of a capacitor C1 which is grounded at its another terminal and an output terminal of the differential amplifier 8. It opens or closes the line when turned off or on.

A switch 4 is provided in a line connecting one terminal of the capacitor C1 and the other input terminal 7b of the adder 7. A switch 5 is provided through which the input terminal 7b of the adder 7 is grounded.

When the switch 3 is turned on, the switch 4 is turned off and the switch 5 is turned on, an output voltage V0 of the differential amplifier 8 is applied to the capacitor C1 so that the voltage V0 is held at the capacitor C1, whereby a grounding voltage of 0 V is applied to the input terminal 7b of the adder 7.

Conversely, when the switch 3 is turned off, the switch 4 is turned on and the switch 5 is turned off, the output voltage V0 is applied to the input terminal 7b of the adder 7. The adder 7 has a multiplier 9 for multiplying a voltage applied to its input terminal 7b by 1/A.

The adder 7 adds the voltage multiplied by 1/A at the multiplier 9 and the voltage received at the input terminal 7a, and supplies the added voltage to a minus input terminal 8a of the differential amplifier 8. The voltage V2 corresponding to the target temperature is applied to the plus input terminal 8b of the differential amplifier 8, as mentioned above.

The differential amplifier 8 outputs the voltage V0 which is A times of a difference between the voltages received at the plus input terminal and the minus input terminal. The output terminal of the differential amplifier 8 is connected through a switch 6 to one terminal of a capacitor C2 whose another terminal is grounded. Each time the switch 6 is turned on, the output voltage V0 of the differential amplifier 8 is applied to the capacitor C2, in which the voltage V0 is held and output therefrom, that is, sample/hold operation is carried out.

The switches 1-6 are operated as follows. When the circuit is in the pre-measurement mode (which will be referred to as the zero adjustment mode, hereinafter) as shown in FIG. 1(a), the switches 1, 4 and 6 are in OFF positions while the switches 2, 3 and 5 are in ON positions. Under this states of the switches, the adder 7 is grounded at the input terminal 7b, and therefore only the input voltage V2 is applied to the input terminal 7a of the adder 7. As a result, the voltage V2 is applied to the minus and plus terminals of the differential amplifier 8. Thus, the differential amplifier 8 performs its subtraction operation of the same voltage V2 at the input terminals and therefore outputs only a voltage A·$\Delta$Vn which corresponds to A times an offset voltage $\Delta$Vn. This results in that the output voltage A·$\Delta$Vn is charged and held in the capacitor C1.

In the measurement mode, the switches 1, 4 and 6 are turned on and the switches 2, 3 and 5 are turned off respectively as shown in FIG. 1(b). With this state of the switches, the voltage A·$\Delta$Vn charged in the capacitor C1 is supplied to the multiplier 9 in which the received voltage is multiplied by 1/A to obtain the offset voltage ΔVn. The adder 8 adds the offset voltage Vn to the voltage V1 and outputs the added voltage (V1+ΔVn) to the minus terminal of the differential amplifier 8. Meanwhile, the voltage V2 is still applied to the plus terminal of the differential amplifier 8. Therefore, the differential amplifier 8 performs subtraction of V2−(V1+ΔVn) and at the same time generates an offset voltage ΔVn+1. Thus, the differential amplifier 8 outputs the voltage V0 as expressed as follows.

$$V0 = A \times \{V2 + \Delta Vn + 1 + (V1 + \Delta Vn)\} \quad (2)$$

Since the offset voltage Vn is nearly equal to the offset voltage Vn+1, the offset can be practically canceled. Therefore, the differential amplifier 8 outputs a voltage V0' having a substantially zero offset as follows.

$$V0' = A \times (V2 - V1) \quad (3)$$

At this time, since the switch 6 is in the ON position, the voltage V0' is held in the capacitor C2 and output therefrom. In this connection, when a change-over time from the zero adjustment mode to the measurement mode is set to be sufficiently short, the offset voltages ΔVn and ΔVn+1 can be made substantially equal each other, whereby an offset can be made substantially zero and a temperature drift can be substantially eliminated.

Figure 3:
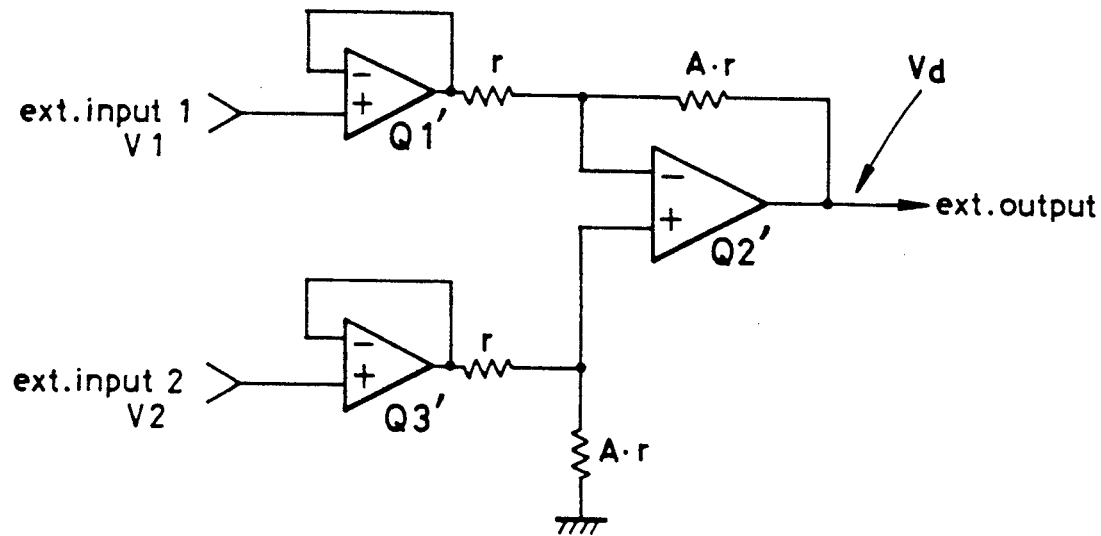
FIG. 3 shows a circuit diagram of an arrangement of a conventional differential amplification circuit.

Referring to FIG. 2(a) showing a detailed circuit configuration which comprises general operational amplifiers Q1 to Q8 (such as uPC1458s produced by NEC). The operational amplifiers Q1, Q3 and Q2 in the circuit of FIG. 2(a) correspond to the operational amplifiers Q1', Q2' and Q3' in the conventional circuit of FIG. 3, respectively. More particularly, the operational amplifier Q1 is a buffer for inputting a detection signal from a sensor (not shown), Q3 a differential amplifier having a gain A, Q2 a buffer for inputting a set value. The circuit of FIG. 2 is different from the conventional circuit of FIG. 3 in that the differential amplification function is combined with the multiplication function of the multiplier 9 of FIG. 1. In other words, the circuit of FIG. 2 is configured so that a resistor RS1 having a resistance r is inserted in a line connecting an output terminal of the buffer Q1 and a minus terminal of the differential amplifier Q3, a resistor RS2 having a resistance 2r is inserted in a line connecting an output terminal of the buffer Q2 and a plus terminal of the differential amplifier Q3, a resistor Rf1 having a resistance Axr is inserted in a feedback line connecting an output terminal of the buffer Q3 and the minus terminal thereof, the differential amplifier Q3 is grounded at its plus terminal through a resistor Rf2 having a resistance Axr, and further a resistor RS3 having a resistance Axr is inserted in a line connecting a switch SW5 and the minus terminal of the differential amplifier Q3.

In FIG. 2(a), the operational amplifier Q5 comprises a measured-data holding circuit having a capacitor C2, and the operational amplifier Q4 comprises an offset holding circuit having a capacitor C1. Switches SW1 to SW6 are analog switches (such as CD4066s produced by Toshiba Corporation) which comprise a MOS FET.

In the following description, ei (i=1−5) is offset voltages of the operational amplifiers Qi (i=1−5).

Referring to FIG. 2(b) which shows waveforms of signals GATE1 and GATE2 applied to the switches SW1 to SW6. Each of the switches SW1 to SW6 is turned on when applied with a signal having a level of +5 V, and turned off when applied with a signal having a level of −5 V. In the zero adjustment mode, the voltage signal GATE1 is at the level of −5 V while the voltage signal GATE2 is at the level of +5 V. In the measurement mode, the voltage signal GATE1 is at the level of +5 V while the voltage signal GATE2 is at the level of −5 V.

In the zero adjustment mode, the switches SW2, SW3 and SW5 are in the ON positions while the switches SW1, SW4 and SW6 are in the OFF positions. Thus, only an input voltage V2 is applied to the plus terminal of the buffer Q1 through the switch SW2 and therefore the buffer Q1 outputs a voltage Va as follows.

$$Va = V2 + e1 \quad (4)$$

Since the voltage V2 is also applied to the buffer Q2, the buffer Q2 outputs a voltage Vc as follows.

$$Vc = V2 + e2 \quad (5)$$

It is assumed that a voltage Vb is applied to one end of the resistor RS3. Then, the set resistance values of the resistors RS1, RS2, RS3, Rf1 and Rf2 cause the differential amplifier Q3 to always output a voltage Vd as follows.

$$\begin{aligned} Vd &= A \times \{Vc + e3 - (Va + Vb/A)\} \\ &= A \times \{Vc + e3 - Va - Vb/A\} \end{aligned} \quad (6)$$

In the zero adjustment mode, the switch SW5 is in the ON position and the switch SW4 is in the OFF position, so that the resistor RS3 is grounded at its one end through the switch SW5 and as a result, Vb=0.

From the equations (4), (5) and (6), in the zero adjustment mode, the differential amplifier Q3 outputs a voltage Vd (zero) as follows.

$$Vd \text{ (zero)} = A \times (e2 - e1 + e3) \quad (7)$$

At this time, since the switch SW3 is in the ON state, the voltage Vd (zero) is held across the capacitor C1. The held voltage Ve is expressed as follows.

$$Ve = Vd \text{ (zero)} = A \times (e2 - e1 + e3) \quad (8)$$

Next, the switches SW1, SW4 and SW6 are turned on while the switches SW2, SW3 and SW5 are turned off. Then, the input voltage V1 is applied to the plus terminal of the buffer Q1 which in turn outputs a voltage Va as follows.

$$Va = V1 + e1 \quad (9)$$

Since the external input voltage V2 is applied to the buffer Q2, the buffer Q2 outputs a voltage Vc as follows.

$$Vc = V2 + e2 \quad (5)$$

Further, since the switch SW4 is in the ON state and the switch SW5 is in the OFF state, the voltage Ve held in the capacitor C1 is applied to one end of the resistor RS2 through the buffer Q4. The applied voltage Vb is as follows.

$$Vb = Ve + e4 = A \times (e2 - e1 + e3) + e4 \quad (10)$$

From the equations (9), (10) and (6), an output voltage Vd (mead.) of the differential amplifier Q3 in the measurement mode is given as follows.

$$\begin{aligned}
Vd\ (\text{mead.}) &= A \times \{Vc + e3 - Va - Vb/A\} \quad (11)\\
&= A \times [V2 + e2 + e3 - V1 - e1 -\\
&\quad \{A(e2 - e1 + e3) + e4\}/A]\\
&= A \times \{V2 - V1 + e2 - e1 + e3 -\\
&\quad (e2 - e1 + e3) - e4/A\}\\
&= A \times (V2 - V1 - e4/A)\\
&= A \times (V2 - V1) - e4
\end{aligned}$$

Since the SW6 is in the ON state in the measurement mode, this voltage Vd (mead.) is held in the capacitor C2 and therefore, the hold voltage Vf becomes Vd. The buffer Q5 functions to output the voltage Vf held in the capacitor C2.

Accordingly, a voltage Vg output from the buffer Q5 is as follows.

$$\begin{aligned}
Vg &= Vf + e5 \quad (12)\\
&= Vd + e5\\
&= A \times (V2 - V1) - e4 + e5
\end{aligned}$$

This voltage Vg corresponds to the output voltage Vd of the equation (1) in the conventional circuit.

From the above description, it will be appreciated that the offset voltage is amplified by A as shown by $A \times (e2 + e3 - e1)$ in the equation (1) whereas the offset voltage is not amplified by A and therefore is small as shown in the equation (12). That is, the offset drift is reduced.

Although the description has been made in connection with the case where the present invention is applied to a temperature control circuit in the foregoing embodiment, the present invention is not limited to the specific example but may be applied to a differential amplification circuit so long as the circuit outputs a difference between two types of input signals.

According to the present invention, even when general operational amplifiers are employed, the offset drift can be reduced. Accordingly, there can be realized a differential amplification circuit which can be easily fabricated in the form of an ASIC while remarkably reducing its offset drift.

What is claimed is:

1. An offset drift reducing device for use in a differential amplification circuit including a differential amplifier having a first input terminal for inputting a first signal and a second input terminal for inputting a second signal, the differential amplifier subtracting a detected value of the first signal from a predetermined value of the second signal, multiplying the value thus subtracted by a predetermined gain A and outputting the value thus multiplied, the offset drift reducing device comprising:

an adder having third and fourth input terminals, for adding a signal which is 1/A times of a signal applied to the third input terminal and a signal applied to the fourth input terminal and for outputting the signal thus added to the first input terminal of the differential amplifier;

first and second switches provided in first and second lines for opening and closing the first and second lines to selectively supply the first signal and the second signal to the fourth input terminal of the adder;

a capacitor one terminal of which is connected to a third line connecting an output terminal of the differential amplifier and the third input terminal of the adder and another terminal of which is grounded;

a third switch for opening and closing the third line connecting the output terminal of the differential amplifier and one end of the capacitor;

a fourth switch for opening and closing the third line connecting one end of the capacitor and the third input terminal of the adder;

a fifth switch connected at its one end to the third input terminal of the adder and grounded at another end, for grounding the third input terminal when turned on; and switch on/off control means for turning off the first and fourth switches and turning on the second, third and fifth switches prior to a measurement and for turning on the first and fourth switches and turning off the second, third and fifth switches during the measurement.

* * * * *